(12) United States Patent
Yamamoto et al.

(10) Patent No.: US 7,630,243 B2
(45) Date of Patent: Dec. 8, 2009

(54) SEMICONDUCTOR MEMORY DEVICE

(75) Inventors: Kaoru Yamamoto, Yamato-kohriyama (JP); Nobuhiko Ito, Tenri (JP); Naoki Ueda, Nara (JP); Yoshimitsu Yamauchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 60 days.

(21) Appl. No.: 12/094,379

(22) PCT Filed: Nov. 1, 2006

(86) PCT No.: PCT/JP2006/321819

§ 371 (c)(1),
(2), (4) Date: May 20, 2008

(87) PCT Pub. No.: WO2007/060815

PCT Pub. Date: May 31, 2007

(65) Prior Publication Data

US 2009/0046514 A1 Feb. 19, 2009

(30) Foreign Application Priority Data

Nov. 25, 2005 (JP) ............................. 2005-339727

(51) Int. Cl.
*G11C 16/04* (2006.01)
(52) U.S. Cl. ............................. 365/185.16; 365/185.05
(58) Field of Classification Search ............ 365/185.16, 365/185.05, 185.25
See application file for complete search history.

(56) References Cited

U.S. PATENT DOCUMENTS

| 5,027,321 | A | | 6/1991 | Park | |
|---|---|---|---|---|---|
| 5,467,300 | A | * | 11/1995 | Komarek et al. | ....... 365/185.16 |
| 5,732,013 | A | | 3/1998 | Von Basse et al. | |

(Continued)

FOREIGN PATENT DOCUMENTS

JP 3-176895 A 7/1991

(Continued)

OTHER PUBLICATIONS

International Search Report mailed Dec. 19, 2006, directed to counterpart international application No. PCT/JP2006/321819; 2 pages.

(Continued)

*Primary Examiner*—Vu A Le
(74) *Attorney, Agent, or Firm*—Morrison & Foerster LLP

(57) ABSTRACT

A virtual ground type semiconductor memory device comprises: a memory cell array in which nonvolatile memory cells each including a first electrode, a pair of second electrodes, and a charge retention part are arranged in row and column directions like a matrix; a read circuit for selecting a pair of the first and second bit lines connected to a selected memory cell to be read, applying first and second read voltages to the selected first and second bit lines, respectively, and detecting a magnitude of a memory cell current flowing in the selected memory cell, at the time of reading; a voltage applying means for applying the second read voltage to a second adjacent bit line adjacent to the selected second bit line on the opposite side of the first bit line; and a short-circuit means for short-circuiting the selected second bit line and the second adjacent bit line.

14 Claims, 7 Drawing Sheets

U.S. PATENT DOCUMENTS

| | | | |
|---|---|---|---|
| 5,757,709 A * | 5/1998 | Suminaga et al. | 365/204 |
| 5,787,039 A * | 7/1998 | Chen et al. | 365/185.22 |
| 2003/0117845 A1 | 6/2003 | Yamauchi | |
| 2004/0159870 A1 | 8/2004 | Ishiguro | |

FOREIGN PATENT DOCUMENTS

| | | |
|---|---|---|
| JP | 9-198889 A | 7/1997 |
| JP | 2003-187584 | 7/2003 |
| JP | 2004-165292 | 6/2004 |

OTHER PUBLICATIONS

Roy et al. (1997). "A New Flash Architecture With a $5.8\lambda^2$ Scalable AMG Flash Cell," *Symposium on VLSI Technology Digest of Technical Papers:* 67-68.

* cited by examiner

SEMICONDUCTOR MEMORY DEVICE

CROSS-REFERENCE TO RELATED APPLICATIONS

This application is a National Phase filing under 35 U.S.C. §371 of International Application No. PCT/JP2006/321819 filed on Nov. 1, 2006, and which claims priority to Japanese Patent Application No. 2005-339727 filed on Nov. 25, 2005.

TECHNICAL FIELD

The present invention relates to a semiconductor memory device comprising a virtual grounding line memory cell array.

BACKGROUND ART

As a cell phone has become increasingly functionalized and a memory card and file market has been enlarged in use recently, a flash memory is required to be large in capacity and low in cost. Thus, in order to implement the large capacity and low cost, a device having a small effective cell area making use of multilevel type and a virtual ground memory cell array type is being developed one after another. Especially, when the virtual ground memory cell array type is employed, since the area of individual memory cell can be reduced by devising a circuit, a device having a relatively small chip area can be implemented in the same process. However, when the virtual ground memory cell array type is used, since a leak current from an adjacent memory cell is inevitable in a reading operation, various inventive approaches are to be taken to implement high-speed and high-precision reading.

As a flash memory making use of the virtual ground memory cell array, a virtual ground memory cell array shown in FIG. 6 has been proposed (refer to non-patent document 1, for example). A reading method of the virtual ground type memory cell array will be described. When a memory cell 2 is selected and read, first, a read voltage Vcc is applied to BLSELn to select a segment including the selected memory cell 2. Then, 5V is applied to a word line WLi+1 and 0V is applied to other word lines. Then, a read voltage 1V is applied to the bit line BLk and other bit lines BL(k+1), BL(K+2), . . . are grounded to 0V. At this time, the read voltage Vcc is applied to SELn' to apply the read voltage to a drain of the cell 2 to be read and 0V is applied to SELn. Thus, since the read voltage 1V is applied to the drain of the selected memory cell 2 to be read and a source is grounded to 0V, a current flowing in the selected memory cell 2 is detected by a sense amplifier and the reading can be performed.

Non-patent document 1: Anirban Roy et al., "A NEW FLASH ARCHITECTURE A 5.8 λ2 SCALABLE AMG FLASH CELL", Symposium on VLSI Technology Digest of Technical Papers, P67, 1997

DISCLOSURE OF THE INVENTION

Problems to be Solved by the Invention

However, according to the virtual ground type memory cell array, the problems is that when a certain selected memory cell is read, since a leak current of a second adjacent memory cell adjacent to the selected memory cell on the source side (second bit line side) fluctuates depending on the state of the second adjacent memory cell, a resistance of the bit line of the selected memory cell on the source side (hereinafter, referred to as the source resistance) fluctuates depending on the state of the second adjacent memory cell, which affects a threshold voltage Vt of the selected memory cell (hereinafter, referred to this affect on the threshold voltage as "virtual ground noise").

The fluctuation of the source resistance due to the leak current will be described taking a virtual ground noise in the conventional technique as an example. FIG. 7 shows a voltage applying condition at the time of a reading operation in the virtual ground memory cell array according to the above prior art. In the case where a memory cell 2 is read as a reading target and a second adjacent memory cell 4 adjacent to the selected memory cell on the source side is in off state, when it is assumed that a source resistance is Rbl, the source resistance is Rbl/2 when the second adjacent memory cell 4 is in on state. That is, the source resistance is changed to Rbl/2 due to the change of the threshold voltage Vt of the second adjacent memory cell 4. Thus, the back bias of the selected memory cell 2 fluctuates and the threshold voltage Vt of the selected memory cell 2 is changed. Thus, since the programmed selected memory cell 2 is affected by the second adjacent memory cell 4 subsequently programmed and its threshold voltage fluctuates, the distribution of the threshold voltage Vt of the selected memory cell 2 after the programming of the second adjacent memory cell 4 has been completed is spread by that fluctuation, which is a serious problem in a memory device such as a multilevel memory that requires a small distribution of the threshold voltage Vt.

The present invention was made to solve the above problem and it is an object of the present invention to provide a semiconductor memory device capable of reducing an effect caused by the fluctuation of the threshold voltage of the memory cell adjacent to the selected memory cell.

Means for Solving the Problem

A semiconductor memory device according to the present invention to attain the above object comprises a memory cell array having nonvolatile memory cells each including a first electrode, a pair of second electrodes, and a charge retention part capable of accumulating and retaining an electric charge injected from the second electrode, the nonvolatile memory cells capable of reading stored contents according to a conductive state between the second electrodes that varies depending on the potential of the first electrode and the accumulated electric charge amount of the charge retention part, and arranged in a row direction and a column direction in a form of a matrix, wherein the first electrodes of the memory cells on the same row are connected to a common word line, one of the second electrodes is connected together between the two adjacent memory cells in the row direction, one of the second electrodes of each of the memory cells on the same column is connected to a common first bit line, the other of the second electrodes of each of the memory cells on the same column is connected to a common second bit line, and the first bit lines and the second bit lines are alternately arranged, and it is characterized as first characteristics by further comprising a read circuit for selecting a pair of the first bit line and the second bit line connected to a selected memory cell to be read, applying a first read voltage to the selected first bit line, applying a second read voltage to the selected second bit line, and detecting a magnitude of a memory cell current flowing in the selected memory cell, at the time of reading, a voltage applying means for applying the second read voltage to a second adjacent bit line serving as the first bit line that is adjacent to the selected second bit line on the opposite side of the selected first bit line, and a short-circuit means for short-circuiting the selected second bit line and the second adjacent bit line.

According to the present invention having the above characteristics, since the second bit line (source side) of the selected memory cell to be read and the second adjacent bit line of a second adjacent memory cell are short-circuited and the same second read voltage as that of the second bit line is applied to the second adjacent bit line, a virtual ground noise due to the change of a threshold voltage Vt of the second adjacent memory cell on the source side can be almost completely suppressed. Furthermore, since the change of a source resistance due to the change of the threshold voltage Vt of the memory cell adjacent to the second adjacent memory cell on the opposite side of the selected memory cell can be suppressed, the virtual ground noise can be reduced as compared with that of the prior art. Thus, since the virtual ground noise can be suppressed and the threshold voltage can be controlled with high accuracy, the threshold voltage Vt can be controlled with high accuracy to implement multilevel. In addition, high-accuracy reading can be implemented.

The semiconductor memory device having the above characteristics is characterized as second characteristics in that the voltage applying means further applies the second read voltage to one or more bit lines that are adjacent to the second adjacent bit line on the opposite side of the selected second bit line at the time of reading.

According to the present invention having the above characteristics, the change of the source resistance due to the change of the threshold voltage Vt of the adjacent memory cell can be suppressed further effectively.

The semiconductor memory device having any one of the above characteristics is characterized as third characteristics in that the voltage applying means further applies the first read voltage to a first adjacent bit line serving as the second bit line that is adjacent to the selected first bit line on the opposite side of the selected second bit line, and the short circuit means short-circuits the selected first bit line and the first adjacent bit line, at the time of reading.

The semiconductor memory device having the above characteristics is characterized as fourth characteristics in that the voltage applying means further applies the first read voltage to one or more bit lines that are adjacent to the first adjacent bit line on the opposite side of the selected first bit line at the time of reading.

The semiconductor memory device having any one of the above characteristics is characterized as fifth characteristics in that the short-circuit means has gates connected to each other by the same control line on every (n+1)th column in a direction of the word line ($n \geq 1$).

According to the present invention having the above characteristics, the number of the control lines can be minimized to two and the source resistance can be effectively reduced.

A semiconductor memory device according to the present invention to attain the above object comprises a memory cell array having nonvolatile memory cells each including a first electrode, a pair of second electrodes, and a charge retention part capable of accumulating and retaining an electric charge injected from the second electrode, the nonvolatile memory cells capable of reading stored contents according to a conductive state between the second electrodes that varies depending on the potential of the first electrode and the accumulated electric charge amount of the charge retention part, and arranged in a row direction and a column direction in the form of a matrix, wherein the first electrodes of the memory cells on the same row are connected to a common word line, one of the second electrodes is connected together between the two adjacent memory cells in the row direction, one of the second electrodes of each of the memory cells on the same column is connected to a common first bit line, the other of the second electrodes of each of the memory cells on the same column is connected to a common second bit line, the first bit lines and the second bit lines are alternately arranged, a block is constituted in units of a predetermined number of the word lines, block selection transistors are provided at the ends of the first bit line and the second bit line in each block, and the block selection transistor is connected to a main bit line, and it is characterized as sixth characteristics by further comprising a read circuit for selecting a pair of the first bit line and the second bit line connected to a selected memory cell to be read, applying a first read voltage to the selected first bit line, applying a second read voltage to the selected second bit line, and detecting a magnitude of a memory cell current flowing in the selected memory cell, at the time of reading, a voltage applying means for applying the second read voltage to a second adjacent bit line serving as the first bit line that is adjacent to the selected second bit line on the opposite side of the selected first bit line, and a short circuit means for short-circuiting the main bit line connected to the selected second bit line and the main bit line connected to the second adjacent bit line.

According to the present invention having the above characteristics, since the bypass transistor is provided on the main bit line and it is shared with the plurality of blocks, the overhead of a chip area can be reduced. Furthermore, according to the present invention having the above characteristics, since the second bit line (source side) of the selected memory cell to be read and the second adjacent bit line of the second adjacent memory cell are short-circuited and the same second read voltage as that of the second bit line is applied to the second adjacent bit line, a virtual ground noise due to the change of a threshold voltage Vt of the second adjacent memory cell on the source side can be almost completely suppressed. Furthermore, since the change of a source resistance due to the change of the threshold voltage Vt of the memory cell adjacent to the second adjacent memory cell on the opposite side of the selected memory cell can be suppressed, the virtual ground noise can be reduced as compared with that of the prior art. Thus, since the virtual ground noise can be suppressed and the threshold voltage can be controlled with high accuracy, the threshold voltage Vt can be controlled with high accuracy to implement multilevel. In addition, high-accuracy reading can be implemented.

A semiconductor memory device according to the present invention to attain the above object comprises a memory cell array having nonvolatile memory cells each including a first electrode, a pair of second electrodes, and a charge retention part capable of accumulating and retaining an electric charge injected from the second electrode, the nonvolatile memory cells capable of reading stored contents according to a conductive state between the second electrodes that varies depending on the potential of the first electrode and the accumulated electric charge amount of the charge retention part, and arranged in a row direction and a column direction in the form of a matrix, wherein the first electrodes of the memory cells on the same row are connected to a common word line, one of the second electrodes is connected together between the two adjacent memory cells in the row direction, one of the second electrodes of each of the memory cells on the same column is connected to a common first bit line, the other of the second electrodes of each of the memory cells on the same column is connected to a common second bit line, the first bit lines and the second bit lines are alternately arranged, a block is constituted in units of a predetermined number of the word lines, block selection transistors are provided at the ends of the first bit line and the second bit line in each block, and the block selection transistor is connected to a main bit line, and it is characterized as seventh characteristics by further comprising a read circuit for selecting a pair of the first bit line and the second bit line connected to a selected memory cell to be read, applying a first read voltage to the selected first bit line, applying a second read voltage to the selected second bit line, and detecting a magnitude of a memory cell current flowing in the selected memory cell, at the time of reading, a voltage applying means for applying the second read voltage to a second adjacent bit line serving as the first bit line that is adjacent to the selected second bit line on the opposite side of the selected first bit line, and a short circuit means for short-circuiting the selected second bit line and the second adjacent bit line.

According to the present invention having the above characteristics, the affect due to the change of the threshold voltage Vt of the adjacent memory cell can be effectively suppressed. Furthermore, according to the present invention having the above characteristics, since the second bit line (source side) of the selected memory cell to be read and the second adjacent bit line of the second adjacent memory cell are short-circuited and the same second read voltage as that of the second bit line is applied to the second adjacent bit line, a virtual ground noise due to the change of the threshold voltage Vt of the second adjacent memory cell on the source side can be almost completely suppressed. Furthermore, since the change of a source resistance due to the change of the threshold voltage Vt of the memory cell adjacent to the second adjacent memory cell on the opposite side of the selected memory cell can be suppressed, the virtual ground noise can be reduced as compared with that of the prior art. Thus, since the virtual ground noise can be suppressed and the threshold voltage can be controlled with high accuracy, the threshold voltage Vt can be controlled with high accuracy to implement multilevel. In addition, high-accuracy reading can be implemented.

The semiconductor memory device having the sixth or seventh characteristics is characterized as eighth characteristics in that the voltage applying means further applies the second read voltage to one or more bit lines that are adjacent to the second adjacent bit line on the opposite side of the selected second bit line at the time of reading.

According to the present invention having the above characteristics, the change of a source resistance due to the change of the threshold voltage Vt of the adjacent memory cell can be more effectively suppressed.

The semiconductor memory device having the sixth or seventh characteristics is characterized as ninth characteristics in that the short-circuit means has gates connected to each other by the same control line on every (n+1)th column in a direction of the word line (n≧1).

According to the present invention having the above characteristics, the number of the control lines can be minimized to two, and the source resistance can be effectively reduced.

The semiconductor memory device according to any one of the above characteristics is characterized as tenth characteristics in that programming of the memory cell is performed sequentially from one end of the word line in a direction of the word line.

According to the present invention having the above characteristics, since the programming is performed sequentially from one end of the word line in the direction of the word line, when a certain memory cell is programmed, as the threshold voltage Vt of the first adjacent memory cell on the drain side has been determined, a leak current of the first adjacent memory cell is kept constant, so that the threshold voltage Vt can be controlled with high accuracy without being affected by the virtual ground noise of the first adjacent memory cell. Furthermore, when a certain memory cell is read, since the effects of leak currents of both first adjacent memory cell on the drain side and the second adjacent memory cell on the source side can be suppressed, the reading operation can be performed with high accuracy.

EXPLANATION OF REFERENCES

MC00, MC01, MC02, MC03, MC04, MC05, MC06, MC07: Memory Cell
WL0, WLn: Word Line
GBL0, GBL1, GBL2, GBL3: Global Bit Line
LBL0, LBL1, LBL2, LBL3, LBL4, LBL5, LBL6, LBL7, LBL8, LBL9: Local Bit Line
SG0, SG1: Block Selection Line
TB0, TB1, TB2, TB3, TB4, TB5, TB6, TB7, TB8, TB9: Block Selection Transistor
TP0, TP1, TP2, TP3, TP4, TP5, TP6, TP7: Bypass Transistor
EQ0, EQ1, EQ2, EQ3: Bypass TR Control Signal
Vrd: Drain Voltage
Vg: Gate Voltage
Iread: Read Current
Icell: Memory Cell Current
Ileak: Adjacent Memory Cell Leak Current
Rbl: Source Resistance

BEST MODE FOR CARRYING OUT THE INVENTION

Embodiments of a semiconductor memory device according to the present invention (hereinafter, referred to as "the present invention device" occasionally) will be described below with reference to the drawings.

FIRST EMBODIMENT

Figure 1:
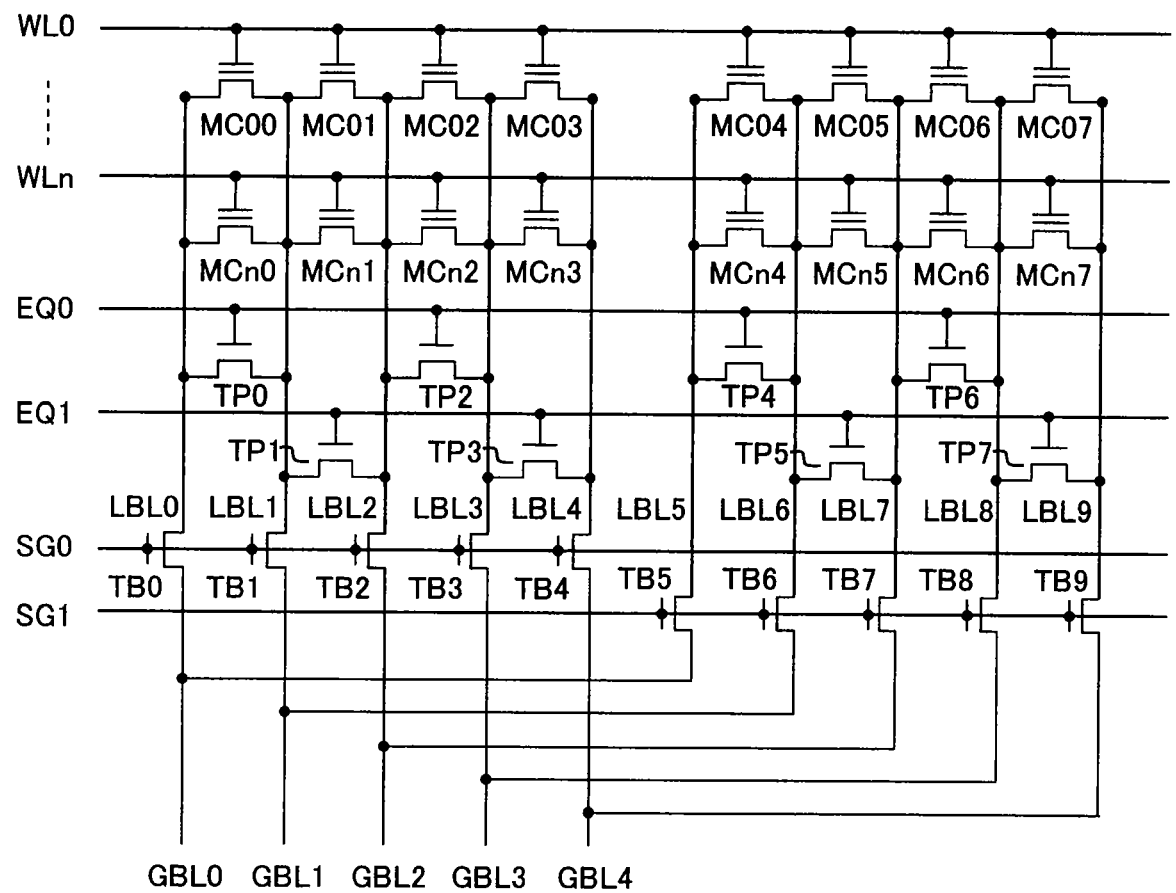
FIG. 1 is a schematic block diagram showing a schematic constitution of a memory cell array according to a first embodiment of a semiconductor memory device in the present invention.

Descriptions of Virtual Ground Memory Cell Array and Operation of Bypass Transistor A first embodiment of the present invention device will be described with reference to FIG. 1. FIG. 1 shows the array constitution of the present invention device according to this embodiment. The present invention device comprises a memory cell array in which nonvolatile memory cells has a first electrode, a pair of second electrodes, and a charge retention part capable of accumulating and retaining a charge injected from the second electrode, and are capable of reading stored contents according to a conductive state between the second electrodes that varies depending on the potential of the first electrode and the accumulated charge amount of the charge retention part, and are arranged in a row direction and a column direction in the form of a matrix.

Furthermore, the memory cell array has a virtual ground line array constitution, and local bit lines (corresponding to first bit lines and second bit lines) LBL0 to LBL9 are shared by the two adjacent memory cells. More specifically, one of the second electrodes is connected together between the two memory cells adjacent to each other in the row direction, one of the second electrodes of the respective memory cells on the same column is connected to the common first bit line, the other of the second electrodes of the respective memory cells on the same column is connected to the common second bit line, and the first bit lines and the second bit lines are alternately arranged. Whether the local bit lines LBL0 to LBL9 are to be the first bit lines or the second bit lines is defined depending on the position of the memory cell to be read.

FIG. 1 shows one of the blocks divided from the virtual ground memory cell array. Referring to FIG. 1, block selection signals SG0 and SG1 control block selection transistors TB0 to TB9. The word lines WL0 to WLn are connected to control gates of the memory cells on the same row. When the memory cells MC00 to MC07 on the same row are selected along the word line WL0, for example, the block selection signal SG0 selects the memory cells MC00 to MC03 and connects the local bit lines LBL0 to LBL4 to the global bit lines (corresponding to the main bit lines) GBL0 to GBL4 via the block selection transistors TB0 to TB4. Similarly, the block selection signal SG1 selects the memory cells MC04 to MC07 and connects the local bit lines LBL5 to LBL9 to the global bit lines GBL0 to GBL4 via the block selection transistors TB5 to TB9. In addition, the global bit lines GBL0 to GBL4 are shared with the plurality of blocks.

Bypass transistors TP0 to TP7 (corresponding to short-circuit means) are provided to electrically connect the adjacent local bit lines. According to this embodiment, the bypass transistors are controlled by bypass TR control signals every other column in the word line direction. More specifically, the bypass transistors TP0, TP2, TP4 and TP6 are controlled by a bypass TR control signal EQ0, and the bypass transistors TP1, TP3, TP5 and TP7 are controlled by a bypass TR control signal EQ1.

Next, a description will be made of the case where the memory cell MC01 is selected from this memory cell array to be read.

First, in order to select the memory cell MC01, the block selection signal SG0 is turned on and the global bit line GBL0 to GBL4 are connected to the local bit lines LBL0 to LBL4 through the block selection transistors TB0 to TB4. Then, a read gate voltage Vg is applied to the word line WL0. Then, in order to apply a read voltage Vrd (corresponding to a first read voltage) to the drain of the selected memory cell MC01, the read voltage Vrd is applied to the global bit line GBL1 and to ground the source, the global bit line GBL2 is grounded to 0V (corresponding to a second read voltage). According to this embodiment, the global bit lines GBL2 to GBL4 are also grounded to 0V. Then, the bypass TR selection signal EQ0 is turned on and the bypass transistors TP0, TP2, TP4 and TP6 are turned on, so that the local bit line LBL2 and the local bit line LBL3 (corresponding to a second adjacent bit line) connected to the drain (source of the selected memory cell MC01) and the source of the adjacent memory cell MC02 are short-circuited. The bypass TR selection signal EQ1 is in off state and the bypass transistors TP1, TP3, TP5 and TP7 are not short-circuited. As described above, a current flowing in the selected memory cell MC01 is detected by a sense amplifier connected to the global bit line GBL2, whereby a reading operation is performed.

In addition, when the selected memory cell is read in the virtual ground memory cell array, there is a current leak through the adjacent memory cell depending on the state of the threshold voltage of the adjacent memory cell. In the case of the adjacent memory cell on the drain side to which the read voltage is applied, a read current flowing in the bit line connected to the drain of the selected memory cell is reduced due to a leak current, which affects the threshold voltage of the selected memory cell. In addition, in the case of the adjacent memory cell on the source side, since a source resistance of a path where the read current of the selected memory cell is grounded to 0V fluctuates due to a leak current, a back bias is changed depending on the source resistance, so that the threshold voltage of the selected memory cell is affected. As described above, when the selected memory cell is read in the virtual ground memory cell array, the threshold voltage is affected by the change in state of the adjacent memory cell on the drain side or the source side (hereinafter, referred to this effect on the threshold voltage as "virtual ground noise").

Figure 2:
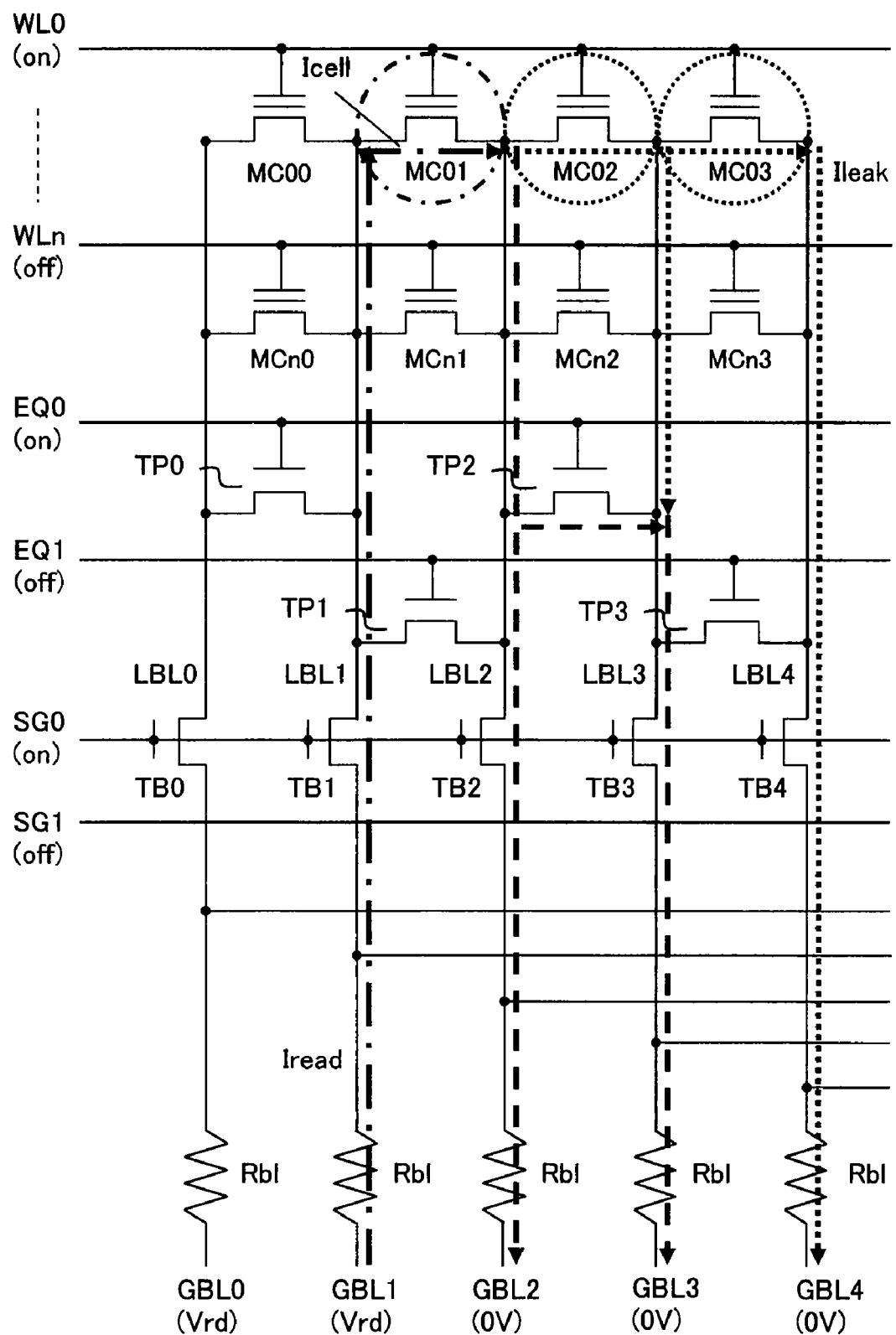
FIG. 2 is a view to explain a reading operation according to the first embodiment of the semiconductor memory device in the present invention.

Description of Reduction Effect of Bypass Transistor on Virtual Ground Noise on Source Side Next, the reduction effect on the virtual ground noise due to the adjacent memory cell on the source side will be described. FIG. 2 shows the state of voltage application in the reading operation of the selected memory cell MC01 shown in FIG. 1, in which a memory cell current flowing in the selected memory cell MC01 is designated by Icell, and a current flowing in the adjacent memory cell MC02 or MC03 on the source side of the selected memory cell MC01 is designated by Ileak. In addition, a resistance value of the global bit line GBL from the bypass transistor to the ground voltage containing on resistances of the block selection transistor and the transistor for grounding the global bit line, and a wiring resistance is designated by Rbl.

A description will be made of the case where the threshold value varies depending on the stored state of the adjacent memory cell MC02 on the source side. When the threshold voltage of the adjacent memory cell MC02 is high, a current does not flow via the adjacent memory cell MC02. At this time, the bypass transistor TP2 is in on state, and the memory cell current flows from the local bit line LBL2 to the global bit line GBL2 through the block selection transistor TB2 and at the same time, flows from the local bit line LBL2 to the global bit line GBL3 through the bypass transistor TP2 and the block selection transistor TB3. Here, when it is assumed that the on resistance of the bypass transistor is smaller than the resistance value Rbl of the global bit line, the resistance value of each global bit line GBL from the bypass transistor to the ground voltage is about Rbl/2.

Meanwhile, when the threshold voltage of the adjacent memory cell MC02 is low, a current Ileak flows through the MC02. At this time, the bypass transistor TP2 is in on state, and the memory cell current flows from the local bit line LBL2 to the global bit line GBL2 through the block selection transistor TB2 and at the same time, flows from the local bit line LBL2 to the global bit line GBL3 through the bypass transistor TP2, the adjacent memory cell MC02 and the block selection transistor TB3. Here, the on resistance when the threshold voltage of the adjacent memory cell MC02 is low is higher than the on resistance of the bypass transistor due to restriction of a cell size, a current flows into the global bit line GBL3 through the bypass transistor mainly. Therefore, the resistance value of the global bit line GBL becomes about Rbl/2 similarly.

In other words, even when the threshold voltage of the selected memory cell MC02 is changed, since the source resistance from the bypass transistor to the ground voltage is not largely changed due to the bypass transistor, the virtual ground noise caused by the selected memory cell MC02 can be suppressed to almost zero.

Next, a description will be made of the case where the threshold voltage of the memory cell MC03 adjacent to the source side of the adjacent memory cell MC02 is changed. When the threshold voltage of the adjacent memory cell MC03 is high, a current does not flow through the adjacent memory cell MC03. At this time, the bypass transistor TP2 is in on state, and the source resistance from the bypass transistor to the ground voltage is about Rbl/2 similar to the case of the adjacent memory cell MC02. Meanwhile, when the threshold voltage of the adjacent memory cell MC03 is low, a current Ileak flows through the memory cell MC03. At this time, since the current Ileak flows from the local bit line LBL4 to the global bit line GBL4 through the block selection transistor TB4, while the resistance value is about Rbl/2 when the threshold voltage of the memory cell MC03 is high, the series resistance of the on resistance of the memory cell MC03 and the resistance value Rbl is connected to the resistance value Rbl/2 in parallel, so that the source resistance is up to about Rbl/3 even when the on resistance of the memory cell MC03 is 0. Thus, the change of the source resistance from the bypass transistor to the ground voltage due to the change of the threshold voltage Vt of the memory cell MC03 can be up to about Rbl/6 by the effect of the bypass transistor, so that the virtual ground noise can be suppressed to about ⅓ or less as compared with the change of the source resistance of about Rbl/2 according to the prior art.

SECOND EMBODIMENT

Description of Programming from One End+Operation of Bypass TR

Figure 3:
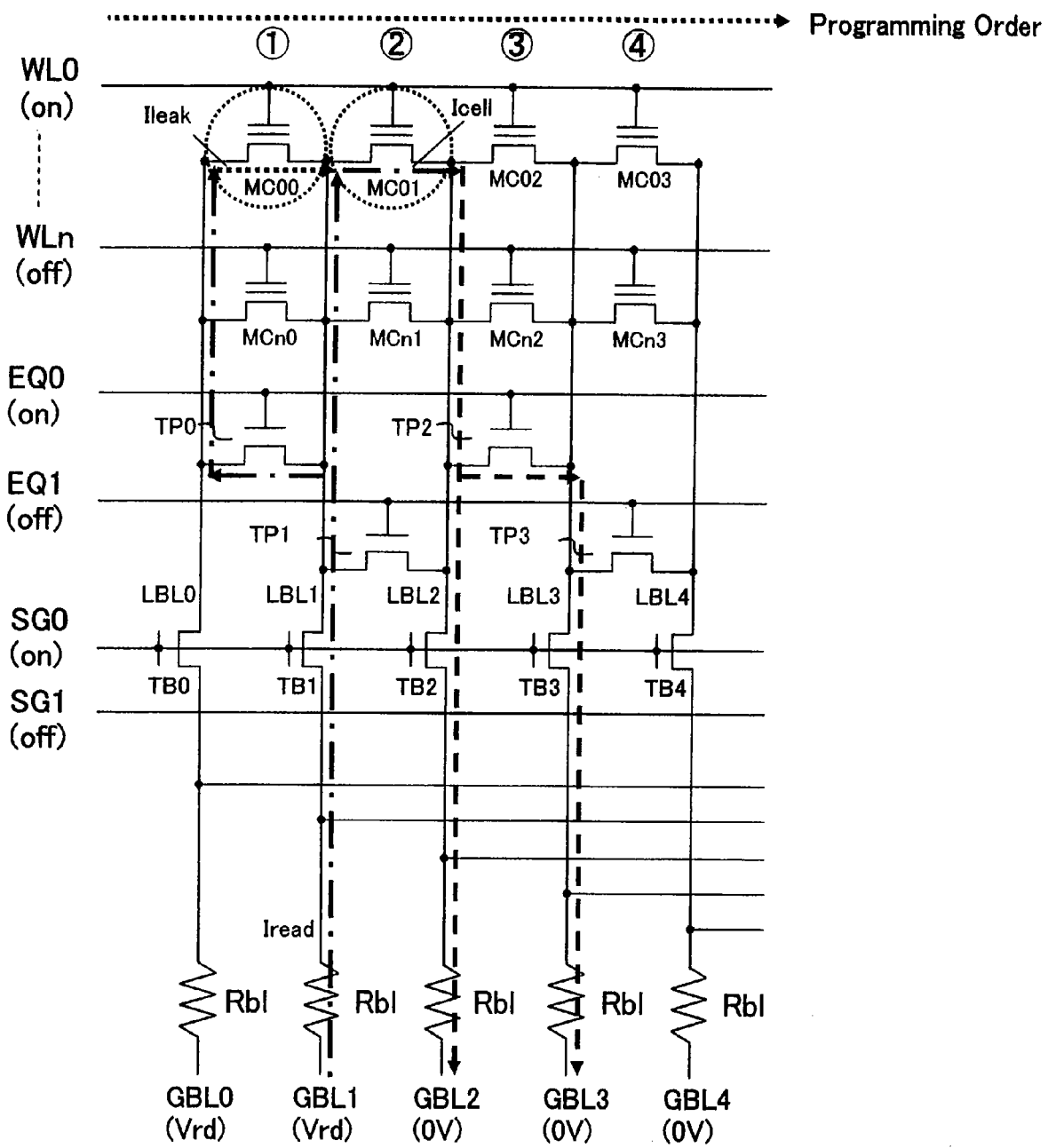
FIG. 3 is a view showing a programming order and a voltage application condition at the time of reading according to a second embodiment of a semiconductor memory device in the present invention.

A second embodiment of the present invention device will be described with reference to FIG. 3. FIG. 3 shows a programming order and a voltage applying state at the time of reading of the present invention device shown in FIG. 1, and here, a description will be made of a suppression method of a virtual ground noise caused by programming from one end on the drain side of the selected memory cell. According to this embodiment, programming is performed sequentially from one end on the drain side in one block. That is, the programming order is defined in each sub-block (memory cell array selected by the same block selection signal SG) of the memory cell array according to the order of the memory cells MC00→MC01→MC02→MC03. Thus, when the selected memory cell MC01 is read, since the threshold voltage of the adjacent memory cell MC00 is always constant, a current Ileak through the adjacent memory cell MC00 is always constant and a read current Iread is always constant. Thus, when the programming order is defined to be from the one end of the drain side, the leak current due to the adjacent memory cell on the drain side can be kept constant all the time, so that the virtual ground noise can be suppressed completely.

As described above, according to the present invention device shown in FIG. 1, when the programming is performed from the one end of the drain side, the virtual ground noise due to the adjacent memory cell on the drain side can be suppressed, and the virtual ground noise due to the adjacent memory cell on the source side of the selected memory cell can be reduced due to the bypass transistor. Thus, since the virtual ground noise due to the adjacent memory cells on both drain and source sides can be suppressed or reduced, the threshold voltage Vt can be controlled with high accuracy at multilevel, whereby reading can be performed with high accuracy.

THIRD EMBODIMENT

Array Constitution when Bypass TR is Controlled by Four Control Signals

Figure 4:
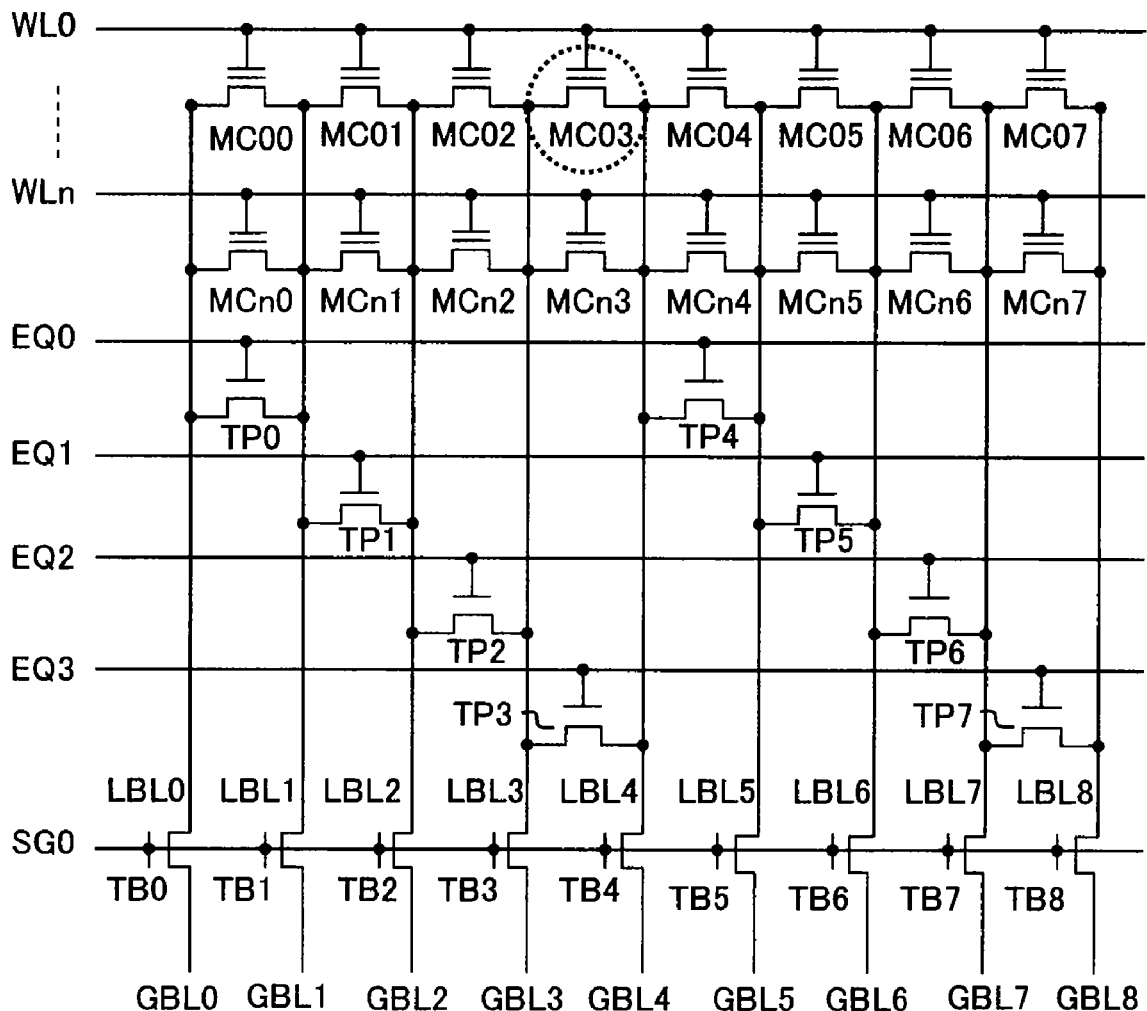
FIG. 4 is a schematic block diagram showing a schematic constitution of a memory cell array according to a third embodiment of a semiconductor memory device in the present invention.

A third embodiment of the present invention device will be described with reference to FIG. 4. FIG. 4 shows one of blocks divided from a virtual ground type memory cell array. As shown in FIG. 4, memory cells MC00 to MCn7 are arranged in a row direction and a column direction in the form of a matrix, and local bit lines LBL0 to LBL8 are shared with the two adjacent memory cells. Block selection transistors TB0 to TB8 are controlled by a block selection signal SG0.

According to this embodiment, the local bit lines LBL0 to LBL8 are connected to global bit lines GBL0 to GBL8 via the block selection transistors TB0 to TB8 by the block selection signal SG0, respectively. The global bit lines GBL0 to GBL8 are shared with the plurality of blocks. Word lines WL0 to WLn are connected to control gates of the memory cells on the same row. Bypass transistors TP0 to TP7 are controlled by bypass TR control signals every fourth column in the word line direction. More specifically, the bypass transistors TP0 and TP4 are controlled by a bypass TR control signal EQ0, the bypass transistors TP1 and TP5 are controlled by a bypass TR control signal EQ1, the bypass transistors TP2 and TP6 are controlled by a bypass TR control signal EQ2, and the bypass transistors TP3 and TP7 are controlled by a bypass TR control signal EQ3.

Next, a description will be made of a reading operation by selecting the memory cell MC03 in the memory cell array.

First, the block selection signal SG0 is turned on to select the memory cell MC03, and the global bit lines GBL0 to GBL8 are connected to the local bit lines LBL0 to LBL8 through the block selection transistors TB0 to TB8, respectively. Then, a read gate voltage Vg is applied to the word line WL0. Then, in order to apply a read voltage Vrd to the drain of the selected memory cell MC03, the read voltage Vrd is applied to the global bit line GBL3, and in order to ground the source, the global bit line GBL4 is grounded to 0V. According to this embodiment, the global bit lines GBL5 to 8 are also grounded to 0V. Then, the bypass TR selection signals EQ0, EQ1 and EQ2 are turned on and the bypass transistors TP4, TP5 and TP6 are turned on, and the local bit lines LBL4, LBL5, LBL6 and LBL7 connected to the adjacent memory cells on the source side are short-circuited. The bypass TR selection signal EQ3 is in off state, so that the bypass transistor TP3 is not short-circuited. As described above, a current flowing in the selected memory cell MC03 is detected by a sense amplifier connected to the global bit line GBL3, whereby a reading operation is performed.

At this time, according to the source resistance when the selected memory cell MC03 is read, the bypass transistors TP4, TP5 and TP6 are in on state, and a memory cell current flows from the local bit line LBL4 to the global bit line GBL4 through the block selection transistor TB4. At the same time, the memory cell current flows from the local bit line LBL4 to the global bit line GBL5 through the bypass transistor TP4, the local bit line LBL5 and the block selection transistor TB5, flows from the local bit line LBL5 to the global bit line GBL6 through the bypass transistor TP5, the local bit line LBL6 and the block selection transistor TB6, and flows from the local bit line LBL6 to the global bit line GBL7 through the bypass transistor TP6, the local bit line LBL7 and the block selection transistor TB7. Here, when the on resistance of the bypass transistor is smaller than a resistance value Rbl of the global bit line, the source resistance from the bypass transistor to the ground voltage is about Rbl/4. Even when the threshold voltages of the adjacent memory cells MC04, MC05 and MC06 are changed, and the threshold voltage of any cell is changed, the source resistance is kept almost constant, so that the virtual ground noise can be suppressed.

As for the affect of the memory cell MC07, when the threshold voltage of the memory cell MC07 is high, the source resistance from the bypass transistor to the ground voltage is about Rbl/4. The source resistance when the threshold voltage of the MC07 is low is at most about Rbl/5. Therefore, the change of the source resistance when the threshold voltage of the memory cell MC07 is changed is about Rbl/20 or less, which can be considerably lowered.

FOURTH EMBODIMENT

Array Constitution when Bypass TR is Shared with Two Blocks

Figure 5:
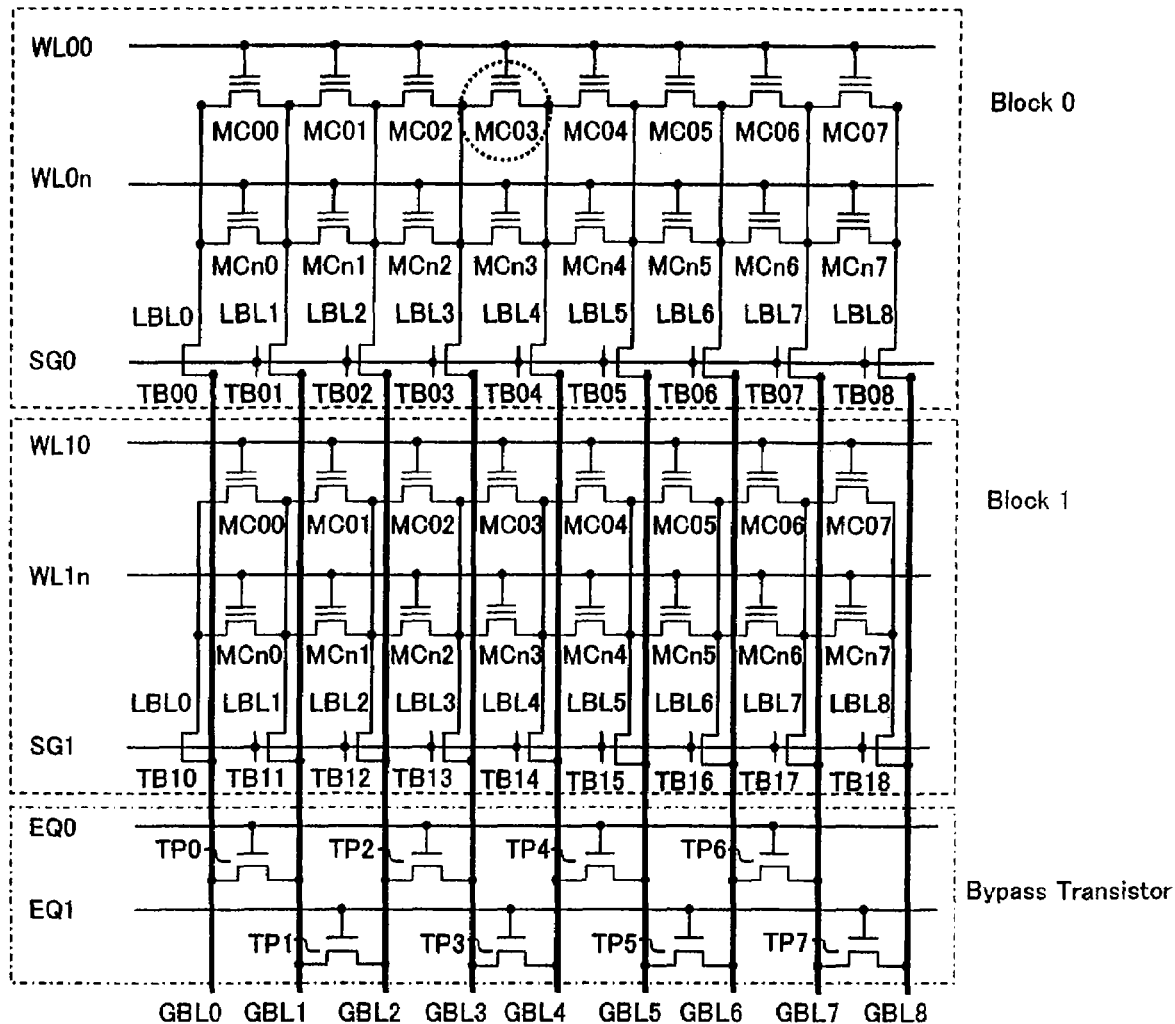
FIG. 5 is a schematic block diagram showing a schematic constitution of a memory cell array according to a fourth embodiment of a semiconductor memory device in the present invention.
Figure 6:
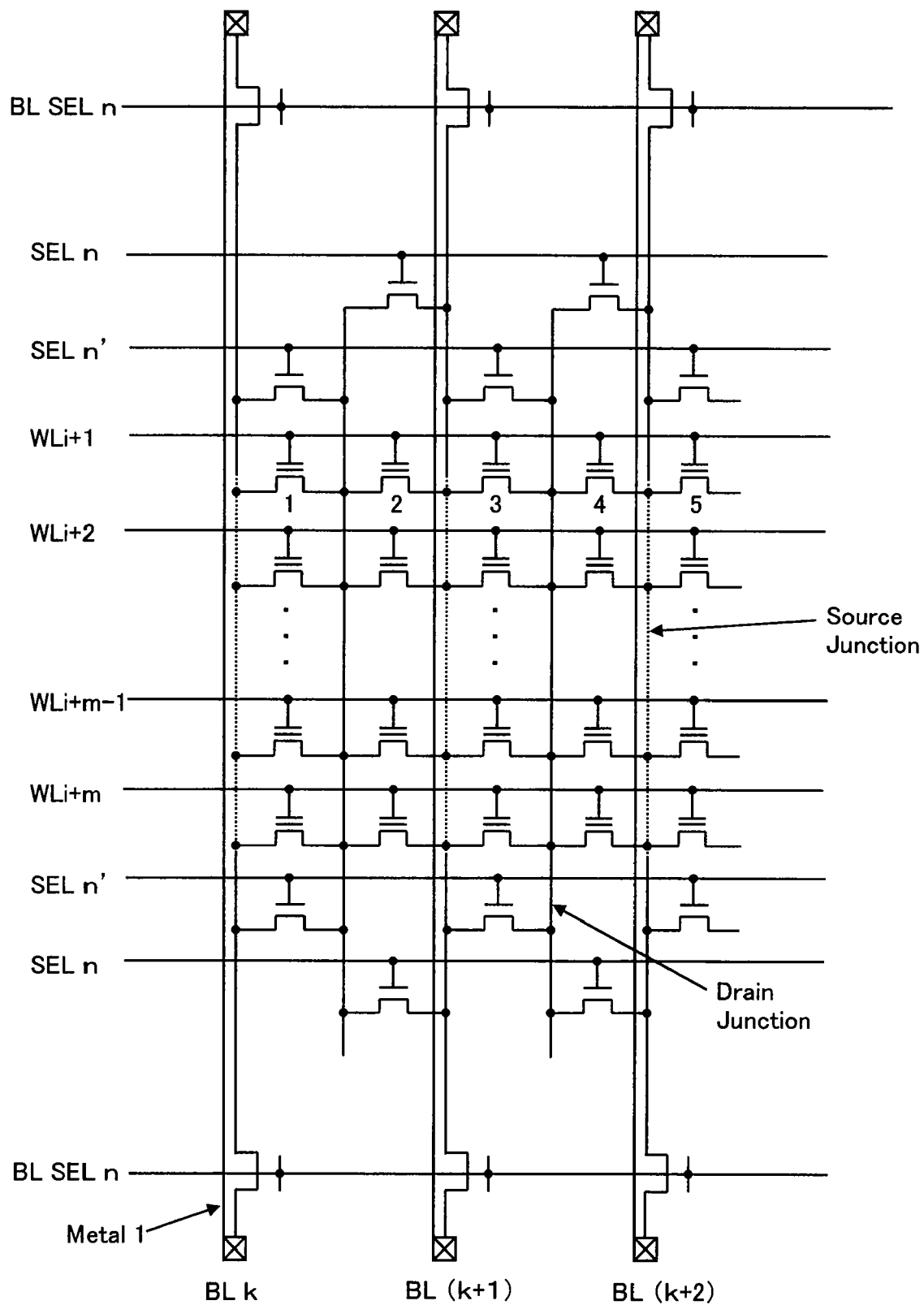
FIG. 6 is a schematic block diagram showing a schematic constitution of a memory cell array according to a conventional semiconductor memory device.
Figure 7:
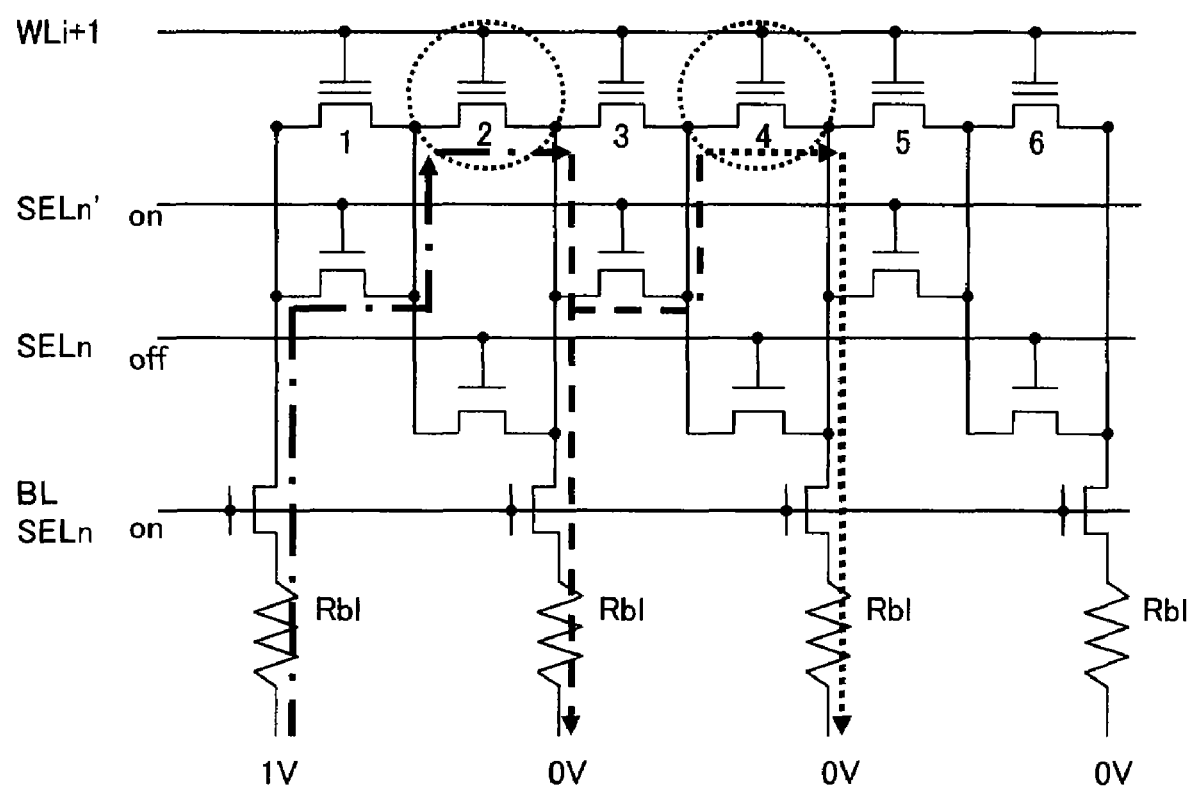
FIG. 7 is a view to explain a reading operation of the conventional semiconductor memory device.

A fourth embodiment of the present invention device will be described with reference to FIG. 5. FIG. 5 shows an array constitution of the present invention device comprising two blocks among divided blocks in a column direction (extending direction of a bit line) in a virtual ground memory cell array. As shown in FIG. 5, memory cells MC00 to MCn7 are arranged in a row direction and a column direction in the form of a matrix in each of blocks 0 and 1. Local bit lines LBL0 to LBL8 of the block 0 and the block 1 are shared by the two adjacent memory cells. Block selection transistors TB00 to TB08 are controlled by a block selection signal SG0. Block selection transistors TB10 to TB18 of the block 1 are controlled by a block selection signal SG1. The local bit lines LBL0 to LBL8 are connected to the global bit lines GBL0 to GBL8 through the block selection transistors TB00 to TB08 by the block selection signal SG0, respectively. The local bit lines LBL0 to LBL8 are connected to the global bit lines GBL0 to GBL8 through the block selection transistors TB10 to TB18 by the block selection signal SG1, respectively. Word lines WL00 to WL0n, WL10 to WL1n are connected to control gates of the memory cells on the same row. Bypass transistors TP0 to TP7 electrically connect between global bit lines, the bypass transistors TP0, TP2, TP4 and TP6 are controlled by a bypass TR control signal EQ0, and the bypass transistors TP1, TP3, TP5 and TP7 are controlled by a bypass TR control signal EQ1.

Next, a description will be made of a reading operation by selecting the memory cell MC03 in the block 0.

First, the block selection signal SG0 is turned on to select the memory cell MC03 and the global bit lines GBL0 to GBL8 are connected to the local bit lines LBL0 to LBL8 through the block selection transistors TB00 to TB08, respectively. Then, a read gate voltage Vg is applied to the word line WL00. Then, in order to apply a read voltage Vrd to the drain of the selected memory cell MC03, a read voltage Vrd is applied to the global bit line GBL3, and in order to ground the source, the global bit line GBL4 is grounded to 0V. According to this embodiment, the global bit lines GBL5 and 8 are also grounded to 0V. Then, the bypass TR selection signal EQ0 is turned on and the bypass transistor TP4 is turned on, and the global bit lines GBL4 and GBL5 connected to the drain (source of the selected memory cell MC03) and the source of the adjacent memory cell MC04 are short-circuited. The bypass TR selection signal EQ1 is turned off so that the bypass transistor TP3 is not short-circuited. As described above, a current flowing in the selected memory cell MC03 of the block 0 is detected by a sense amplifier connected to the global bit line GBL3, whereby a reading operation is performed.

According to the source resistance when the selected memory cell MC03 of the block 0 is read, since the bypass transistor TP4 is in on state, a memory cell current flows from the local bit line LBL4 to the global bit line GBL4 through the block selection transistor TB04. At the same time, the memory cell current flows from the global bit line GBL4 to the global bit line GBL5 through the bypass transistor TP4. Here, when the on resistance of the bypass transistor is smaller than a resistance value Rbl of the global bit line, the source resistance from the bypass transistor to the ground voltage is about Rbl/2. Even when the threshold voltage of the adjacent memory cell MC04 is changed, the source resistance is kept almost constant due to the bypass transistor TP4, so that the virtual ground noise can be suppressed. As for the affect of the memory cell MC05, when the threshold voltage of the memory cell MC05 is high, the source resistance from the bypass transistor to the ground voltage is about Rbl/2. When the threshold voltage of the memory cell MC05 is low, the source resistance from the bypass transistor to the ground voltage is at most about Rbl/3 even when the on resistance of the memory cell MC05 is 0. Thus, due to the effect of the bypass transistor, the change of the source resistance from the bypass transistor to the ground voltage due to the change of the threshold voltage Vtno of the memory cell MC05 is at most about Rbl/6, so that the virtual ground noise can be suppressed to ⅓ or less as compared with the change of the source resistance of about Rbl/2 in the prior art.

As described above, according to the memory cell array constitution in the present invention device, reading can be performed with high accuracy. Furthermore, since the bypass transistor can be shared with the plurality of blocks, the chip size can be prevented from being increased in this case.

Although the description has been made of the fact that the virtual ground line noise on the source side due to the leak current on the source side can be reduced by short-circuiting the second bit line on the source side of the selected memory cell (MC01 or MC03) to be read and the second adjacent bit line of the adjacent memory cell on the source side, and applying the ground voltage to each of them, since the first bit line on the drain side of the selected memory cell and the first bit line (first adjacent bit line) of the adjacent memory cell on the drain side are short-circuited and the read voltage Vrd is applied to each of them, the virtual ground line noise on the drain side due to the leak current on the drain side can be also reduced.

The invention claimed is:

1. A semiconductor memory device comprising:
a memory cell array having nonvolatile memory cells each including a first electrode, a pair of second electrodes, and a charge retention part capable of accumulating and retaining an electric charge injected from the second electrode, the nonvolatile memory cells capable of reading stored contents according to a conductive state between the second electrodes that varies depending on a potential of the first electrode and an accumulated electric charge amount of the charge retention part, and arranged in a row direction and a column direction in a form of a matrix, wherein the first electrodes of the memory cells on the same row are connected to a common word line, one of the second electrodes is connected together between the two adjacent memory cells in the row direction, one of the second electrodes of each of the memory cells on the same column is connected to a common first bit line, the other of the second electrodes of each of the memory cells on the same column is connected to a common second bit line, and the first bit lines and the second bit lines are alternately arranged;

a read circuit for selecting a pair of the first bit line and the second bit line connected to a selected memory cell to be read, applying a first read voltage to the selected first bit line, applying a second read voltage to the selected second bit line, and detecting a magnitude of a memory cell current flowing in the selected memory cell, at the time of reading;

a voltage applying means for applying the second read voltage to a second adjacent bit line, the second adjacent bit line being the first bit line that is adjacent to the selected second bit line on the opposite side of the selected first bit line; and a short-circuit means for short-circuiting the selected second bit line and the second adjacent bit line.

2. The semiconductor memory device according to claim 1, wherein
the voltage applying means further applies the second read voltage to one or more bit lines that are adjacent to the second adjacent bit line on the opposite side of the selected second bit line at the time of reading.

3. The semiconductor memory device according to claim 1, wherein
the voltage applying means further applies the first read voltage to a first adjacent bit line, the first adjacent bit line being the second bit line that is adjacent to the selected first bit line on the opposite side of the selected second bit line, and the short circuit means short-circuits the selected first bit line and the first adjacent bit line, at the time of reading.

4. The semiconductor memory device according to claim 3, wherein the voltage applying means further applies the first read voltage to one or more bit lines that are adjacent to the first adjacent bit line on the opposite side of the selected first bit line at the time of reading.

5. The semiconductor memory device according to claim 1, wherein the short-circuit means has gates connected to each other by the same control line on every (n+1)th column in a direction of the word line, wherein n≧1.

6. A semiconductor memory device comprising:
a memory cell array having nonvolatile memory cells each including a first electrode, a pair of second electrodes, and a charge retention part capable of accumulating and retaining an electric charge injected from the second electrode, the nonvolatile memory cells capable of reading stored contents according to a conductive state between the second electrodes that varies depending on a potential of the first electrode and an accumulated electric charge amount of the charge retention part, and arranged in a row direction and a column direction in a form of a matrix, wherein the first electrodes of the memory cells on the same row are connected to a common word line, one of the second electrodes is connected together between the two adjacent memory cells in the row direction, one of the second electrodes of each of the memory cells on the same column is connected to a common first bit line, the other of the second electrodes of each of the memory cells on the same column is connected to a common second bit line, the first bit lines and the second bit lines are alternately arranged, a block is constituted in units of a predetermined number of the word lines, block selection transistors are provided at the ends of the first bit line and the second bit line in each block, and the block selection transistor is connected to a main bit line;

a read circuit for selecting a pair of the first bit line and the second bit line connected to a selected memory cell to be read, applying a first read voltage to the selected first bit line, applying a second read voltage to the selected second bit line, and detecting a magnitude of a memory cell current flowing in the selected memory cell, at the time of reading;

a voltage applying means for applying the second read voltage to a second adjacent bit line, the second adjacent bit line being the first bit line that is adjacent to the selected second bit line on the opposite side of the selected first bit line; and a short circuit means for short-circuiting the main bit line connected to the selected second bit line and the main bit line connected to the second adjacent bit line.

7. A semiconductor memory device comprising:
a memory cell array having nonvolatile memory cells each including a first electrode, a pair of second electrodes, and a charge retention part capable of accumulating and retaining an electric charge injected from the second electrode, the nonvolatile memory cells capable of reading stored contents according to a conductive state between the second electrodes that varies depending on a potential of the first electrode and an accumulated electric charge amount of the charge retention part, and arranged in a row direction and a column direction in a form of a matrix, wherein the first electrodes of the memory cells on the same row are connected to a common word line, one of the second electrodes is connected together between the two adjacent memory cells in the row direction, one of the second electrodes of each of the memory cells on the same column is connected to a common first bit line, the other of the second electrodes of each of the memory cells on the same column is connected to a common second bit line, the first bit lines and the second bit lines are alternately arranged, a block is constituted in units of a predetermined number of the word lines, block selection transistors are provided at the ends of the first bit line and the second bit line in each block, and the block selection transistor is connected to a main bit line;

a read circuit for selecting a pair of the first bit line and the second bit line connected to a selected memory cell to be read, applying a first read voltage to the selected first bit line, applying a second read voltage to the selected second bit line, and detecting a magnitude of a memory cell current flowing in the selected memory cell, at the time of reading;

a voltage applying means for applying the second read voltage to a second adjacent bit line, the second adjacent bit line being the first bit line that is adjacent to the selected second bit line on the opposite side of the selected first bit line; and a short circuit means for short-circuiting the selected second bit line and the second adjacent bit line.

8. The semiconductor memory device according to claim 6, wherein the voltage applying means further applies the second read voltage to one or more bit lines that are adjacent to the second adjacent bit line on the opposite side of the selected second bit line at the time of reading.

9. The semiconductor memory device according to claim 6, wherein the short-circuit means has gates connected to each other by the same control line on every (n+1)th column in a direction of the word line, wherein n≧1.

10. The semiconductor memory device according to claim 1, wherein programming of the memory cell is performed sequentially from one end of the word line in a direction of the word line.

11. The semiconductor memory device according to claim 7, wherein the voltage applying means further applies the second read voltage to one or more bit lines that are adjacent to the second adjacent bit line on the opposite side of the selected second bit line at the time of reading.

12. The semiconductor memory device according to claim 7, wherein the short-circuit means has gates connected to each other by the same control line on every (n+1)th column in a direction of the word line, wherein n≧1.

13. The semiconductor memory device according to claim 6, wherein programming of the memory cell is performed sequentially from one end of the word line in a direction of the word line.

14. The semiconductor memory device according to claim 7, wherein programming of the memory cell is performed sequentially from one end of the word line in a direction of the word line.

* * * * *